US012658646B2

(12) United States Patent
Delestre et al.

(10) Patent No.: US 12,658,646 B2
(45) Date of Patent: Jun. 16, 2026

(54) ELECTRICAL CONNECTOR FOR A SAFETY RESTRAINT SYSTEM AND A TESTING METHOD THEREOF

(71) Applicant: Tyco Electronics France SAS, Pontoise (FR)

(72) Inventors: Quentin Delestre, Pontoise (FR); Steven Lord, Pontoise (FR); Xavier Rouillard, Pontoise (FR)

(73) Assignee: TE Connectivity Solutions GmbH, Schaffhausen (CH)

( * ) Notice: Subject to any disclaimer, the term of this patent is extended or adjusted under 35 U.S.C. 154(b) by 502 days.

(21) Appl. No.: 18/314,392

(22) Filed: May 9, 2023

(65) Prior Publication Data

US 2023/0361512 A1 Nov. 9, 2023

(30) Foreign Application Priority Data

May 9, 2022 (FR) ...................................... 2204369

(51) Int. Cl.
| | |
|---|---|
| *H01R 13/639* | (2006.01) |
| *G01R 31/66* | (2020.01) |
| *H01R 13/642* | (2006.01) |

(52) U.S. Cl.
CPC ........... *H01R 13/642* (2013.01); *G01R 31/66* (2020.01); *H01R 13/639* (2013.01); *H01R 2201/26* (2013.01)

(58) Field of Classification Search
None
See application file for complete search history.

(56) References Cited

U.S. PATENT DOCUMENTS

| | | | | |
|---|---|---|---|---|
| 9,147,971 B2* | 9/2015 | Osada | ................. | H01R 13/641 |
| 9,780,502 B2* | 10/2017 | Nuetzel | ................. | H01R 13/71 |

(Continued)

FOREIGN PATENT DOCUMENTS

| | | |
|---|---|---|
| EP | 0734100 A2 | 9/1996 |
| EP | 3116075 A1 | 1/2017 |

(Continued)

OTHER PUBLICATIONS

Search Report and Written Opinion from the Intellectual Property Office of France dated Mar. 23, 2023, corresponding to Application No. FR2204369, 9 pages.

(Continued)

*Primary Examiner* — Tho D Ta
(74) *Attorney, Agent, or Firm* — Barley Snyder

(57) ABSTRACT

An electrical connector for a safety restraint system of a motor vehicle comprises a housing, a pair of electrical terminals, a shunt and a connector position assurance (CPA) device. The housing includes a first end and a second end, the second end extending in a mating direction of the connector. Each of the electrical terminals traverses the housing from the first end to the second end. The shunt is adapted to short-circuit the pair of electrical terminals, and comprises two shunt arms each having a contact portion and a linking portion, and a shunt bridge linking the linking portions of the shunt arms. The CPA device is moveably arranged in the housing between an unlocked position and a locked position. In the locked position the CPA device lifts the shunt from a short-circuiting position across the terminals.

20 Claims, 5 Drawing Sheets

(56)                    References Cited

U.S. PATENT DOCUMENTS

| 10,236,640 B2* | 3/2019 | Pamart .................. H01R 13/71 |
| 2002/0072262 A1 | 6/2002 | Richard, Jr. |
| 2004/0192099 A1 | 9/2004 | Seminara et al. |
| 2012/0112762 A1 | 5/2012 | Odorfer et al. |
| 2018/0151989 A1 | 5/2018 | Pamart et al. |

FOREIGN PATENT DOCUMENTS

| JP | 2001110505 A | 4/2001 |
| JP | 2012529735 A | 11/2012 |
| JP | 2015216049 A | 12/2015 |
| JP | 6282524 B2 | 2/2018 |

OTHER PUBLICATIONS

Korean Office Action dated Oct. 30, 2024 with English translation, corresponding to Application No. 10-2023-0059117, 10 pages.
Extended European Search Report dated Sep. 19, 2023, corresponding to Application No. 23172060.8-1201, 8 pages.
Notice of Reasons for Refusal dated May 28, 2024 with English translation, corresponding to Application No. 2023-076021, 13 pages.
European Patent Office Examination Report dated Sep. 30, 2025, corresponding to Application No. 23 172 1 060.8-1201, 5 pages.

* cited by examiner

ELECTRICAL CONNECTOR FOR A SAFETY RESTRAINT SYSTEM AND A TESTING METHOD THEREOF

CROSS-REFERENCE TO RELATED APPLICATION

This application claims the benefit of French Patent Application No. 2204369 filed on May 9, 2022, the whole disclosure of which is incorporated herein by reference.

FIELD OF THE INVENTION

The present invention relates to an electrical connector for a safety restraint system of a motor vehicle, and in particular to a squib-type connector for an airbag system. The invention also relates to a testing method for the electrical connector.

BACKGROUND

Electrical connectors for safety restraint systems are known in the art to comprise two electrical terminals housed in a housing. The electrical terminals are configured to be attached, for example crimped, to electrical conductors of an electrical cable. The electrical connectors typically comprise connector position assurance (CPA) devices, which are moveably arranged in the housing from an unlocked position, also called delivery position or initial position, to a locked position, also called final position or mated position. CPA devices are adapted to securely lock electrical connectors when mated with mating electrical connectors. The CPA devices can also prevent the electrical connectors from being mated with or unmated from mating electrical connectors in a wrong or inadvertent way.

For example, in safety restraint systems, an electrical connector can be a squib-type connector configured to be mated to an electrical connector of an airbag system and can in a trigger event convey an electrical signal to the airbag system to activate a squib charge. The CPA device thus performs the critical function of ensuring the safe operation of the electrical connection.

It is also known to provide the electrical terminals of the electrical connector with an integrated shunt device which short-circuits the two electrical terminals. The shunt device thus prevents an unintended electrical signal from being conveyed to a mating electrical connector, for example in the moment of the mating of the electrical connector with a mating electrical, or during an initial stage of a cabling installation.

In this configuration, the CPA device, when moved from an unlocked to a locked position, mechanically displaces at least one component of the shunt device and lifts the short-circuiting of the electrical terminals. When the CPA device is in a locked position, electrical signals can be conveyed to the mating electrical connector in an unimpeded way and the electrical connection is rendered safe for operation. The shunting function of the shunt device is critical during the installation of the connectors, but typically of lesser importance during the majority of the lifetime of the connector. The CPA device therefore fulfils in this configuration the additional function of lifting the short-circuiting of a shunt device integrated in the connector.

However, integrating a shunt device in the electrical terminals increases the complexity and production cost of the electrical terminals. In particular, the electrical terminals require high reliability and durability, and are thus manufactured in expensive materials, for example particularly corrosion-resistant and conductive materials. Manufacturing an integrated shunt device in one piece with the electrical terminals in the same material therefore represents an additional cost burden.

Further, testing of the electrical conductivity of the electrical connector, for example in the context of routine testing by a harness maker, requires several steps which can be inconvenient. In particular, the CPA device may have to be artificially moved into a locked position by means of a dedicated counterpart in order to lift the short-circuiting, and then to be moved back into the unlocked position by means of another dedicated counterpart for final installation.

In view of the above, improved electrical connectors for safety restraint systems are desired.

SUMMARY

An electrical connector for a safety restraint system of a motor vehicle according to the present disclosure comprises a housing, a pair of electrical terminals, a shunt and a connector position assurance (CPA) device. The housing includes a first end and a second end, the second end extending in a mating direction of the connector. Each of the electrical terminals traverses the housing from the first end to the second end. The shunt is adapted to short-circuit the pair of electrical terminals, and comprises two shunt arms each having a contact portion and a linking portion, and a shunt bridge linking the linking portions of the shunt arms. The CPA device is adapted to assure mating of the connector with a mating connector in the mating direction. The CPA device is moveably arranged in the housing between an unlocked position and a locked position. In the locked position the CPA device lifts the shunt from a short-circuiting position across the terminals.

BRIEF DESCRIPTION OF THE DRAWINGS

These and/or other aspects, features, and advantages of the invention will become apparent and more readily appreciated from the following description of example embodiments, taken in conjunction with the accompanying drawings of which.

DETAILED DESCRIPTION

Figure 1A:
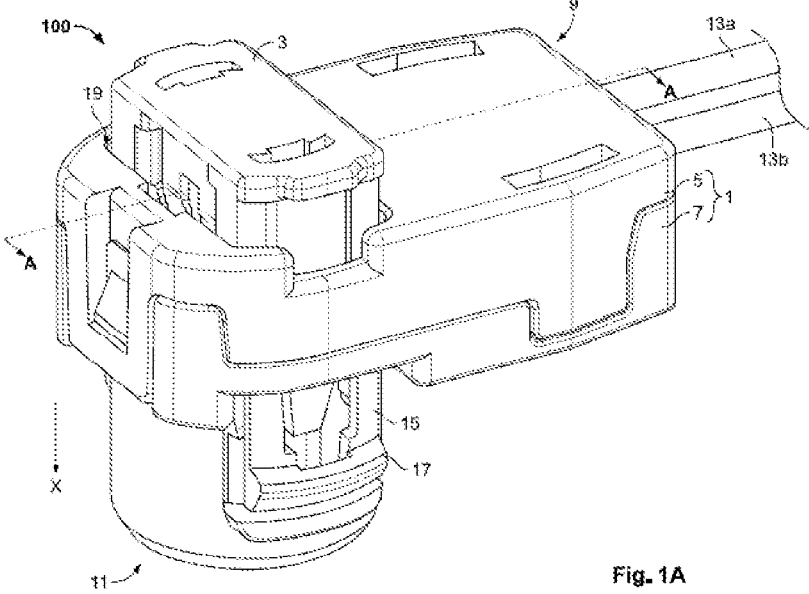
FIG. 1A is a perspective view of an electrical connector according to an embodiment of the invention, wherein a CPA device thereof is in an unlocked position.

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

An embodiment of the electrical connector 100 of the invention is described with reference to the exterior views shown in FIGS. 1A and 1B, which illustrate the locking function of the CPA device. The connector 100 in this embodiment is a squib-type connector for an airbag system and comprises a housing 1 and a connector position assurance (CPA) device 3. In this embodiment, the housing 1 includes a top shell 5 and a lower shell 7 which are fit together by a form fit connection.

The housing has a first extremity or end 9 and a second extremity or end 11. The first extremity 9 is configured to receive two insulated electrical conductors, shown for illustrative purposes in references 13a,13b. In this embodiment, the first extremity 9 and the electrical conductors 13a,13b extend along a direction y orthogonal to a mating direction x. The second extremity 11 extends along the mating direction x and is configured to be received by a mating electrical connector and establishing a mating connection therewith. In this embodiment, the connector has an L-shape and is a 90°-exit-type connector. Other shapes, such as an elongated shape in a 180°-exit-type connector are, however, also possible.

The second extremity 11 comprises a latching tongue 15 comprising a latching lip 17. The latching tongue 15 extends in mating direction x and is resiliently attached on one side along the mating direction x to the lower shell 7. The latching lip 17 protrudes radially outwards from a portion of the latching tongue 15. It is understood that a similar or identical latching tongue may be provided on the other side of the connector 100.

The CPA device 3 is received in the housing 1 through a traversing hole 19 in the top shell 5 of the housing. The structure of the CPA device 3 will be described more in detail in the following section in reference to FIG. 3.

In FIG. 1A, the CPA device 3 is positioned in the connector 100 in an unlocked position. In the unlocked position, the CPA device 3 is not fully inserted in the housing 1 through the traversing hole 19. Instead, in the unlocked position, the CPA device 3 is only partially inserted in the housing 1 and partially protrudes towards the outside of the top shell 5. Therefore, the CPA device 3 can be manually moved into the locked position by a push or manual biasing into the mating direction x. Further, in this unlocked position, the latching tongue 15 of the housing 1 is manually or mechanically displaceable in a direction z orthogonal to the mating direction x, by virtue of the resilient attachment at its one end.

Figure 1B:
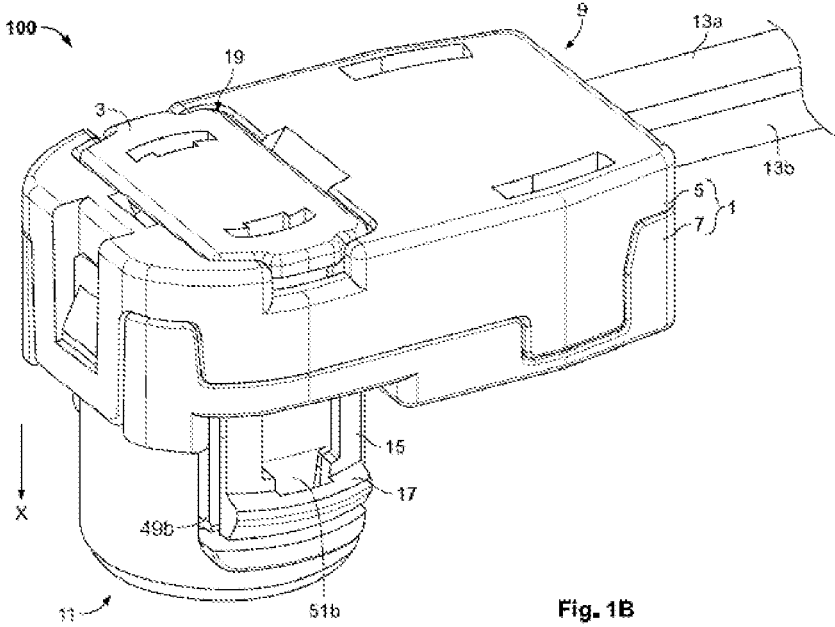
FIG. 1B is another perspective view of the connector of FIG. 1A, wherein the CPA device is in a locked position.

In FIG. 1B, the CPA device 3 has been moved by a push into a locked position in the connector 100. In the locked position, the CPA device 3 is fully inserted in the housing 1 through the traversing hole. The CPA device 3 in the locked position no longer protrudes towards the outside of the top shell 5. Here, the connector 100 is shown with the CPA device 3 in locked position without the presence of the mating electrical connector. In practical use, the CPA device 3 can, however, only be moved into the locked position when the connector 100 is mated with a mating electrical connector.

In this position, the latching tongue 15 is blocked by the blocking arm 51a and by the guiding arms 49b,49c (49c visible only on FIG. 3) of the CPA device 3. The blocking arm 51a prevents the latching tongue 15 from being physically displaced towards the inside of the housing 1. As a result, a mating connector may be locked to the connector 100.

Figure 2A:
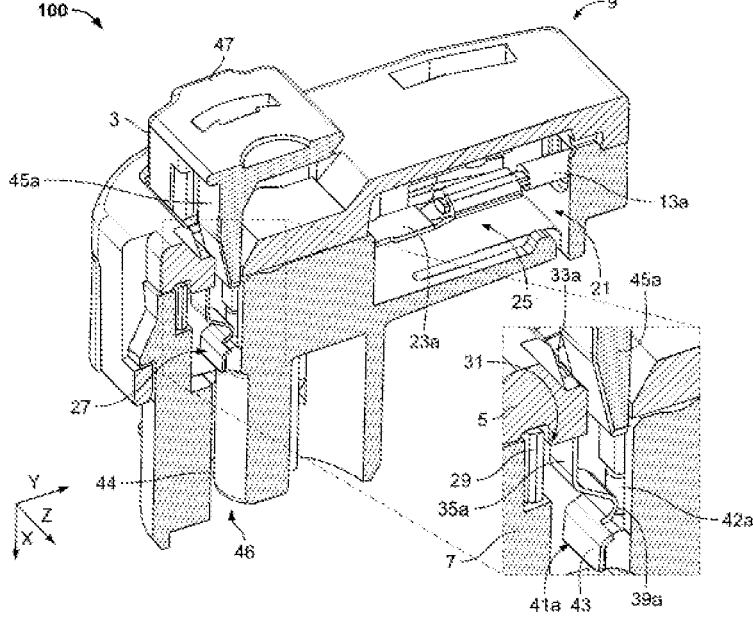
FIG. 2A is a cross-sectional view along the axis A of the connector for FIG. 1A, including an enlarged view of a shunt engagement zone with the terminals.
Figure 2B:
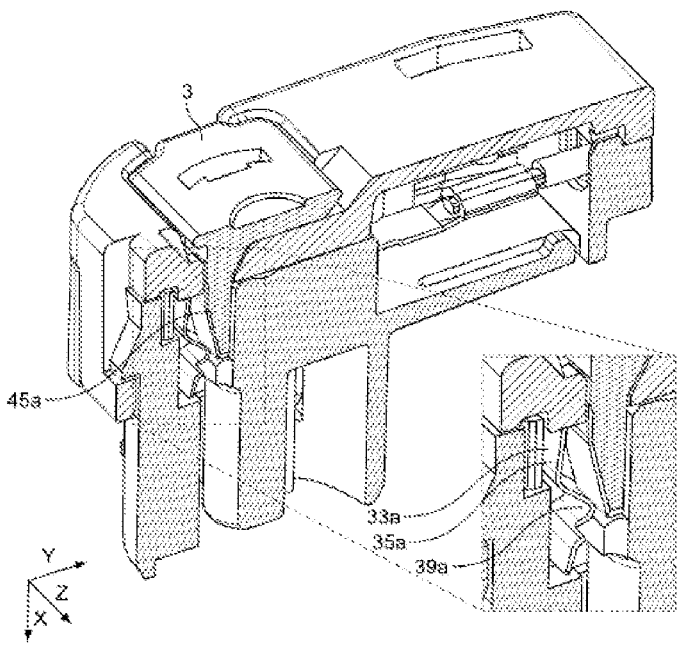
FIG. 2B is another cross-sectional the view wherein the CPA device is in a locked position, as shown in FIG. 1B.

The interior structure of the connector 100 is now described with reference to FIGS. 2A and 2B, displaying a three-dimensional cross-sectional view of the connector, which illustrate the short-circuit lifting function of the CPA device 3. FIGS. 2A and 2B display cross-sections along a cross-sectional plane A as shown in the unlocked connector of FIG. 1A. The plane A corresponds to an x-y plane through the middle of the connector 100. It is understood that in this embodiment, the connector 100 is broadly symmetrical about the plane A and corresponding features can be found on the non-visible side of the connector 100.

FIG. 2A shows a primary junction space 21 formed in the first extremity 9 of the connector 100. In the primary junction space 21, a junction portion 25 of a first electrical terminal 23a is arranged extending along the first extremity 9 in the direction y orthogonal to the mating direction x. For illustrative purposes, the junction portion 25 is shown in FIG. 2A to be crimped on an insulation-stripped part of the electrical conductor 13a.

A shunt 27 is disposed in the housing 1. The shunt 27 comprises a shunt bridge 29 which is sandwiched in the x-z plane between the lower shell 7 and the upper shell and extends along an inner surface of the lower shell 7 of the housing 1. The shunt bridge 29 is locked by form fit to the housing 1 by a blocking ridge 31 formed on the top shell 5. The structure of the shunt 27 and of the electrical terminals 23a,23b will be described in more detail in the following sections in reference to FIGS. 4 and 5.

Figure 4:
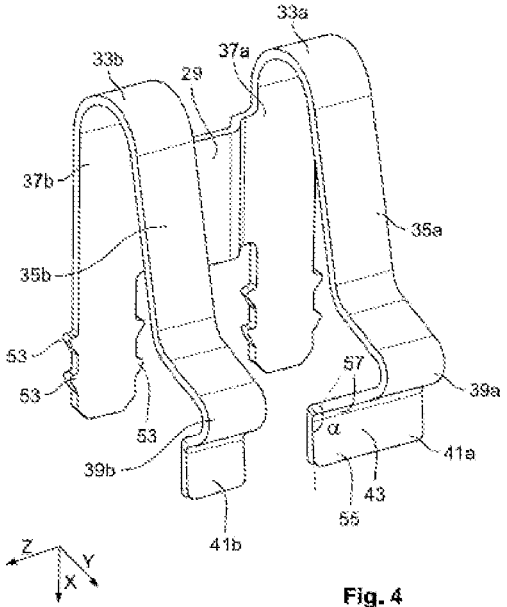
FIG. 4 is a three-dimensional perspective view of the shunt of the first connector.
Figure 5:
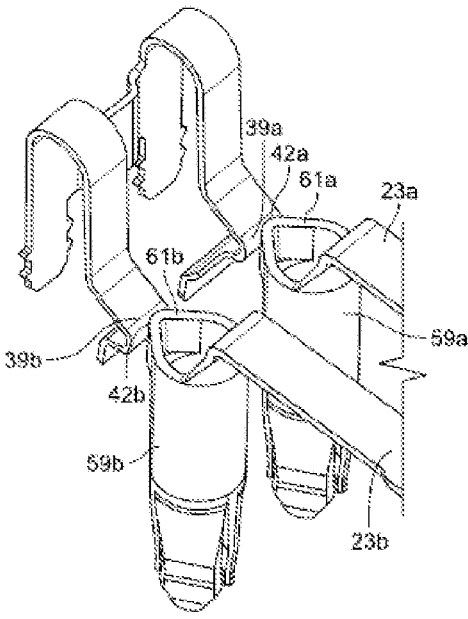
FIG. 5 is a three-dimensional perspective view of the shunt and the electrical terminals, wherein the shunt is engaged with the electrical terminals.

FIG. 2A illustrates that the shunt 27 comprises a first shunt arm 33a with a contact portion 35a. A first linking portion 37a linking the first shunt arm 33a to the shunt bridge 29 is not visible on FIG. 2A but is illustrated in FIGS. 4 and 5. The contact portion 35a extends at least partially in the mating direction x and comprises a raised or bulged contact surface 39a, and a distal extremity 41a in mating direction x. The bulged contact surface 39a of the shunt arm 33a protrudes in the y direction perpendicular to the mating direction x to engage with a shunting surface 42a of the electrical terminal 23a.

On the corresponding side not visible of FIG. 2A, bulged contact surface 39b, as shown in FIG. 4, is engaged with the shunting surface 42b, as shown in FIG. 5. Thus, the shunt 27 establishes a short-circuiting of the electrical terminals 23a, 23b.

The distal extremity 41a of the contact portion 35a of the shunt arm 33a comprises a cantilever protrusion 43 extending in the mating direction x and protruding in a direction z orthogonal to the mating direction x from the contact portion 35a. The features and functions of the cantilever protrusion 43 will be described in following sections.

The lower shell 7 of the housing 1 comprises an elongated space 44 extending from an opening 46 at the second extremity 11 inside the housing 1 so that the cantilever protrusion 43 of the shunt 27 is accessible from the outside.

FIG. 2A further shows a first displacement prong 45a of the CPA device 3, which protrudes orthogonally from a main body 47 of the CPA device in the mating direction x. In the unlocked position shown in FIG. 2A, the CPA device 3 is not fully inserted in the traversing hole 19 of the top shell 5. The displacement prong 45a is not in contact with the bulged contact surface 39a of the shunt 27 and the contact portion 35a therefore is at rest, thus engaged with the shunting surface 42a.

FIG. 2B shows the view of FIG. 2A, wherein the CPA device 3 has been moved from the unlocked position into the locked position. In this position, the prong 45a has moved in the mating direction x and displaced the contact portion 35a in a direction opposed to the direction y. Thus, the prong 45a separates the engagement of the bulged contact surface 39a of the shunt arm 33a with the shunting surface 42a, hidden by the prong 45a in FIG. 2B, and the short-circuiting of the electrical terminals 23a,23b by the shunt 27 has been lifted. The CPA device 3 displaced only the shunt 27 and not the electrical terminals 23a,23b. This arrangement can increase the durability of the electrical contacts.

Figure 3:
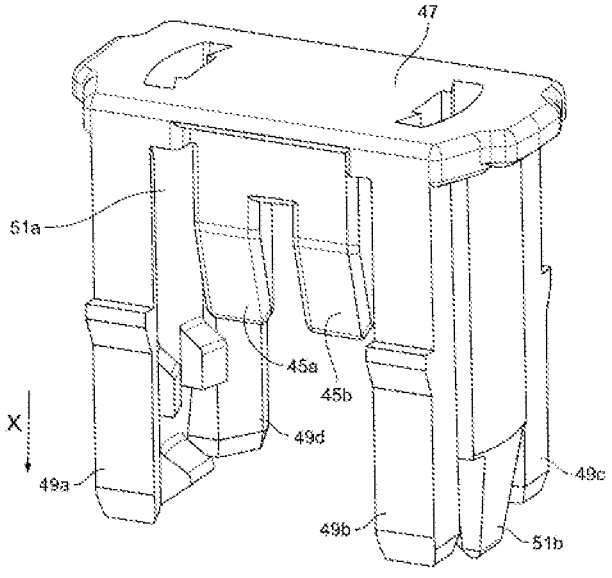
FIG. 3 is a three-dimensional perspective view of the CPA device of the first connector.

FIG. 3 is a three-dimensional perspective view of the CPA device 3. The CPA device 3 comprises a main body 47 and two displacement prongs 45a,45b protruding orthogonally from the main body 47 in the mating direction x. The CPA device 3 further comprises four guiding arms 49a,49b,49c, 49d at each corner of the main body 47 to guide the CPA device 3 inside the housing 1 of the connector 100. The CPA device 3 further comprises two blocking arms 51a,51b to secure the connection between the connector 100 and its mating connector.

FIG. 4 is a three-dimensional perspective view of the shunt 27 with the two shunt arms 33a,33b and the shunt bridge 29. The shunt arms 33a,33b comprise linking portions 37a,37b and contact portions 35a,35b. The shunt bridge 29 links the linking portions 37a,37b on the shunt arms 33a,33b. The linking portions 37a,37b extend further beyond the shunt bridge where they further comprise hooks 53 to establish a form fit connection with corresponding recesses in the lower shell 7 of the housing 1 for the connection 100.

The contact portions 35a,35b extend at least partially in the mating direction x and comprise the bulged contact surfaces 39a,39b, which can be plated with a noble metal, in particular gold. The use of a noble metal reduces the contact resistance and increases the corrosion resistance of the contact with the shunting surfaces 42a,42b.

A cantilever protrusion 43 protrudes from the distal extremity 41a of the contact portion 35a in a direction z orthogonal to the mating direction x. In this embodiment, the cantilever protrusion 43 protrudes towards the distal extremity 41b of the other contact portion 35b, such that the cantilever protrusion 43 is located in between the two shunt arms 33a,33b.

The cantilever protrusion 43 has a first surface portion 55 and a second surface portion 57. Preferably, the first surface portion 55 of the cantilever protrusion 43 is parallel to the extension direction of the elongated space 44. That is, in this embodiment, the first surface portion is arranged parallelly to the mating direction x. Alternatively or in addition, the first surface portion 55 can be arranged orthogonally to the engagement of the bulged contact surface 39a with the shunting surface 42a. That is, the first surface portion 55 can be arranged parallelly to the x-z plane.

The first and second surface portions 55,57 are arranged at an angle α with respect to each other, α being the acute angle between the two surface portions. The angle α has an angular value of more than 90° and less than 180°. For example, in this embodiment, the angle α has an angular value comprised between 130° to 150°.

The shunt 29 is preferably a single body in an electrically conductive material. Therefore, the shunt 29 is able to short-circuit the electrical circuit between the bulged contacts surfaces 39a,39b. In addition, the shunt can be manufactured in a different material from the terminals 23a,23b, in particular a material less noble for the limited use of the shunt, for example copper or aluminium.

The contact portions 35a,35b form springs together with the linking portions 37a,37b, when they are fitted in the housing 1. Therefore, the contact portions 35a, 35b can be displaced, in particular along a direction y orthogonal to the mating direction x, when they are mechanically actuated, for example by a testing pin or the CPA device 3 inserted along the elongated space 44.

FIG. 5 is a three-dimensional perspective view of the shunt 27 and the electrical terminals 23a,23b and represents their respective positioning in an unlocked position of the CPA device 3. FIG. 5 shows mating portions 59a,59b of the electrical terminals 23a,23b which extend inside the second extremity 11 of the housing 1 along the mating direction x. The mating portions 59a,59b are configured to receive mating pins of the mating electrical connector. The electrical terminals 23a,23b thus form an L-shape traversing the housing 1 from the first extremity 9 to the second extremity 11.

The mating portions 59a,59b of the electrical terminals 23a, 23b comprise juts 61a,61b protruding in the direction opposed to the direction y. The juts 61a,61b present outwardly the shunting surfaces 42a,42b, which are engaged with the respective bulged contact surfaces 39a,39b of the shunt so that the short circuit is established.

Figure 6A:
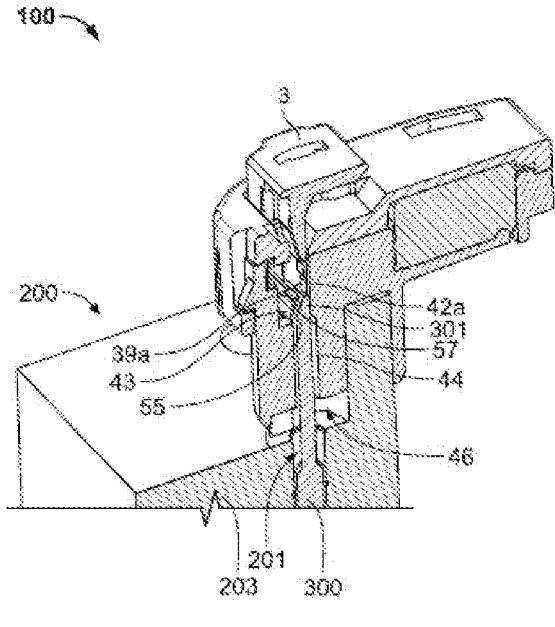
FIG. 6A is a cross-sectional view of the electrical connector of the embodiment during a testing procedure.
Figure 6B:
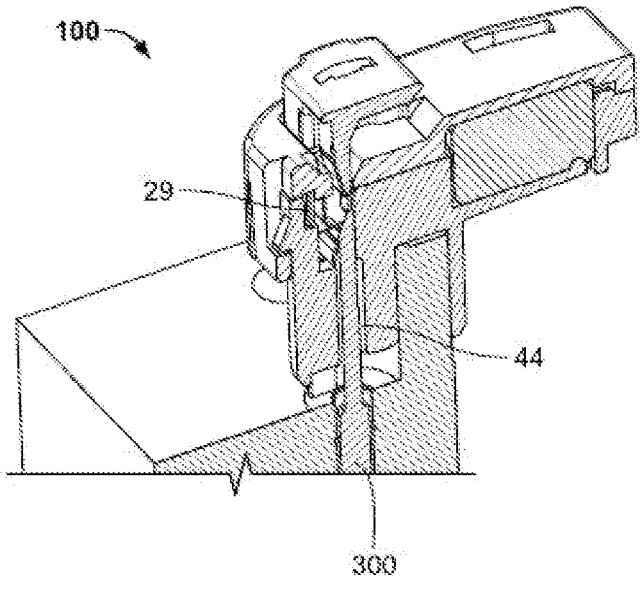
FIG. 6B is another cross-sectional view of the electrical connector of the embodiment during a testing procedure.

FIGS. 6A and 6B display the electrical connector 100 during a testing procedure in which an electrical testing signal used to check the performance of the connector is ascertained. In FIG. 6A, the connector 100 is in the unlocked position and the CPA device 3 is not fully pushed inside the housing 1.

The connector 100 is mounted on a testing counterpart 200 capable of measuring an electrical signal between the electrical terminals 23a,23b, not visible in FIG. 6A but illustrated in FIG. 5. The testing counterpart 200 comprises a passageway 201 extending along the mating direction x through a baseplate 203 of the testing counterpart 200. A testing pin 300, made of an electrical isolating material, is inserted through the passageway 201 of the counterpart 200 and through the opening 46 in the housing 1 into the elongated space 44.

In FIG. 6A, the testing pin 300 is partially inserted, and the bulged contact surface 39a just starts to be disengaged from the shunting surface 42a, as the tip 301 of the pin 300 has engaged with the cantilever protrusion 43, along the cantilever surfaces 55,57.

In FIG. 6B, the testing pin 300 has been fully inserted into the connector 100 through the elongated space 44 and the tip 301 of the pin 300 now fully isolates the shunt 29 from the terminals 23a,23b. The testing pin 300 is sufficiently thin to only interact with the cantilever surface 55 and/or 57 but does not touch the bulged surface 39a with its plating.

The provision of a separate shunt 29 in the housing 1, and the positioning of the cantilever protrusion 43 as described above allows for a convenient and safe external actuation a shunt arm. In particular, the displacement of the contact portion when engaged with an electrical terminal can be facilitated. The external mechanical actuation by the testing pin 300 moves the contact portion 35*a* in a desired direction away from the engagement, thus lifting the short-circuiting of the terminals 23*a*,23*b*, without risk of damage to or modification of the connector 100. The testing pin 300 only interacts with the cantilever protrusion 43 so that noble metal plated part of the shunt cannot get damaged. As a result, the electrical connector 100 can be tested quickly, without having the repeatedly move the CPA device 3 from one position to another and without having to connect the connector 100 with a mating connector device.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. An electrical connector for a safety restraint system of a motor vehicle configured to be mated along a mating direction with a mating electrical connector, comprising:

a housing having a first end and a second end, the second end extending in the mating direction;

two electrical terminals, each terminal traversing the housing from the first end to the second end;

a shunt adapted to short-circuit the two terminals, the shunt comprising two shunt arms each having a contact portion and a linking portion, and a shunt bridge linking the linking portions of the shunt arms, one contact portion includes a cantilever protrusion protruding from the contact portion, the cantilever protrusion protrudes towards the other contact portion such that the cantilever protrusion is located between the two shunt arms; and a connector position assurance (CPA) device adapted to assure mating of the connector with the mating connector, the CPA device is moveably arranged in the housing between an unlocked position and a locked position, in the locked position the CPA device lifting the shunt from a short-circuiting position.

2. The electrical connector according to claim 1, wherein the shunt bridge and the linking portions of the shunt arms are fixed within the housing by means of at least one of a form fit or a friction fit.

3. The electrical connector according to claim 1, wherein the shunt bridge and the linking portions of the shunt arms are arranged in the housing.

4. The electrical connector according to claim 3, wherein each one of the contact portions is resiliently engaged with a respective one of the two electrical terminals.

5. The electrical connector according to claim 4, wherein the contact portion of at least one of the two shunt arms is adapted to be displaced by the CPA device as the CPA device is moved into the locked position.

6. The electrical connector according to claim 5, wherein the at least one contact portion extends at least partially in the mating direction.

7. The electrical connector according to claim 6, wherein the at least one contact portion includes the cantilever protrusion protruding from the contact portion in a second direction.

8. The electrical connector according to claim 7, wherein the second direction is orthogonal to the mating direction.

9. The electrical connector according to claim 7, wherein the cantilever protrusion protrudes from a distal end of a contact portion of the shunt arm.

10. The electrical connector according to claim 7, further comprising an elongated space extending from an opening at the second end of the housing to the cantilever protrusion of the shunt.

11. The electrical connector according to claim 7, wherein the cantilever protrusion includes a first surface portion and a second surface portion, the first and second surface portions being arranged at an angle with respect to each other.

12. The electrical connector according to claim 11, wherein at least one of the contact portions comprises a raised contact surface engaging with a respective surface of the electrical terminals.

13. The electrical connector according to claim 12, wherein the at least one raised contact surface is plated with a noble metal.

14. An electrical connector, comprising:

a housing;

a pair of electrical terminals arranged within the housing;

a shunt adapted to selectively short-circuit the pair of electrical terminals, the shunt including two shunt arms each having a contact portion, one contact portion includes a cantilever protrusion protruding from the contact portion, the cantilever protrusion protrudes towards the other contact portion such that the cantilever protrusion is located between the two shunt arms; and a connector position assurance (CPA) device adapted to assure mating of the connector with a mating connector, the CPA device moveably arranged in the housing between an unlocked position wherein the shunt is placed in a short-circuiting position across the pair of electrical terminals, and a locked position wherein the CPA device lifts the shunt from the short-circuiting position.

15. The electrical connector according to claim 14, wherein each one of the contact portions is resiliently engaged with a respective one of the electrical terminals.

16. The electrical connector according to claim 14, wherein the contact portion of at least one of the two shunt arms is displaced by the CPA device as the CPA device is moved into the locked position.

17. The electrical connector according to claim 14, wherein each of the shunt arms further includes a linking portion, and the shunt includes a bridge linking the linking portions of the shunt arms.

18. The electrical connector according to claim 17, wherein the shunt bridge and the linking portions of the shunt arms are arranged in the housing.

19. A method of the testing of an electrical connector comprising the steps of:

arranging a connector position assurance (CPA) device of the electrical connector in an unlocked position wherein two terminals of the connector are short-circuited;

placing the connector on a testing counterpart adapted to measure an electrical signal between the two electrical terminals of the connector;

actuating a testing pin of the testing counterpart to displace at least one contact portion of a shunt arm of a shunt of the connector such that the terminals are no longer short-circuited, the shunt includes two shunt arms each having a contact portion, the at least one contact portion includes a cantilever protrusion protruding from the at least one contact portion, the cantilever protrusion protrudes towards the other contact portion such that the cantilever protrusion is located between the two shunt arms; and measuring an electrical signal between the two electrical terminals.

20. An electrical connector for a safety restraint system of a motor vehicle configured to be mated along a mating direction with a mating electrical connector, comprising:

a housing having a first end and a second end, the second end extending in the mating direction;

two electrical terminals, each terminal traversing the housing from the first end to the second end;

a shunt adapted to short-circuit the two terminals, the shunt comprising two shunt arms each having a contact portion and a linking portion, and a shunt bridge linking the linking portions of the shunt arms; and a connector position assurance (CPA) device adapted to assure mating of the connector with the mating connector, the CPA device is moveably arranged in the housing between an unlocked position and a locked position, in the locked position the CPA device lifting the shunt from a short-circuiting position, the shunt bridge is arranged in the housing in both the unlocked position and the locked position.

* * * * *